US007759683B2

(12) United States Patent
Lee

(10) Patent No.: US 7,759,683 B2

(45) Date of Patent: Jul. 20, 2010

(54) WHITE LIGHT EMITTING DIODE

(75) Inventor: Ik Soo Lee, Seoul-Si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 120 days.

(21) Appl. No.: 11/435,400

(22) Filed: May 15, 2006

(65) Prior Publication Data

US 2007/0126011 A1 Jun. 7, 2007

(30) Foreign Application Priority Data

Dec. 1, 2005 (KR) ...................... 10-2005-0116520

(51) Int. Cl.
*H01L 33/00* (2010.01)

(52) U.S. Cl. ............................ 257/79; 257/81; 257/89; 257/98; 257/99; 257/100; 257/E33.001

(58) Field of Classification Search .................. 257/79, 257/80, 81–86, 88, 90, 91–93, 95, 98–100, 257/E33.001; 362/231, 800, 236, 240; 313/1, 313/498; 438/28, 29, 35, 22, 23
See application file for complete search history.

(56) References Cited

U.S. PATENT DOCUMENTS

| | | | | |
|---|---|---|---|---|
| 6,084,250 | A * | 7/2000 | Justel et al. | 257/89 |
| 6,252,254 | B1 * | 6/2001 | Soules et al. | 257/89 |
| 6,476,410 | B2 * | 11/2002 | Ishinaga | 257/13 |
| 6,513,949 | B1 * | 2/2003 | Marshall et al. | 362/231 |
| 6,576,930 | B2 * | 6/2003 | Reeh et al. | 257/98 |
| 6,603,258 | B1 * | 8/2003 | Mueller-Mach et al. | 313/501 |
| 6,635,987 | B1 * | 10/2003 | Wojnarowski et al. | 313/498 |
| 6,936,862 | B1 * | 8/2005 | Chang et al. | 257/100 |
| 6,940,101 | B2 * | 9/2005 | Yano et al. | 257/98 |
| 7,129,638 | B2 * | 10/2006 | Ng | 313/512 |
| 2005/0110036 | A1 * | 5/2005 | Park et al. | 257/99 |
| 2006/0067073 | A1 * | 3/2006 | Ting | 362/231 |

FOREIGN PATENT DOCUMENTS

| | | | |
|---|---|---|---|
| CN | 1621490 A | * | 6/2005 |
| WO | WO 03/080763 | * | 2/2003 |
| WO | WO 2004/097949 | * | 11/2004 |
| WO | WO 2006/028312 | * | 3/2006 |

OTHER PUBLICATIONS

"LEDs for General Illumination OIDA Roadmap Update 2002", Ed. JeffY. Tsao. Oct. 2002. Optoelectronics Industry Development Association (OIDA)-Sandia National Laboratories. <http://lighting.sandia.gov/lightingdocs/OIDA_SSL_LED_Roadmap_Full.pdf>.*

Krames, M. et al. "Status and Future of High-Power Light-Emitting Diodes for Solid State Lighting", Jun. 2007, Journal of Display Technology, vol. 3, pp. 160-175.*

Tamaki, H. and Murazaki, Y. Phosphors for Lamps. "Phosphor Handbook". Ed. William Yen et al. CRC Press: Boca Raton, 2006. p. 359-433.*

* cited by examiner

*Primary Examiner*—Steven Loke
*Assistant Examiner*—Suberr Chi
(74) *Attorney, Agent, or Firm*—Innovation Counsel LLP

(57) ABSTRACT

The present invention relates to a white light emitting diode comprising a blue light emitting diode chip; a green light emitting diode chip; and a molding member that encapsulates the blue light emitting diode chip and the green light emitting diode chip, the molding member containing a red fluorescent substance.

4 Claims, 6 Drawing Sheets

320a A 330a 360a 340a 380 370 350 340b 330b 360b A 320b

WHITE LIGHT EMITTING DIODE

This application claims priority under 35 USC 119 by virtue of Korean Patent Application No. 10-2005-0116520 filed on Dec. 1, 2005, the disclosure of which is incorporated herein by reference in its entirety.

BACKGROUND OF THE INVENTION

1. Field of the Invention

The present invention relates to a white light emitting diode, and more particularly, to a white light emitting diode, wherein a molding member with a red fluorescent substance mixed therein is formed on a blue light emitting diode chip and a green light emitting diode chip.

2. Description of the Related Art

As red, orange, green, blue and white light emitting diodes with high luminance have recently appeared with the development of compound semiconductor technology, light emitting diodes, which were mainly used for simple indicators, dial plates and the like in the prior art, have been applicable to a variety of fields in which full colors, high reliability, low power consumption and miniaturization are required. In particular, as the illumination efficiency of a white light emitting diode is superior to that of an incandescent bulb, the appearance of the white light emitting diode shows possibility of use as an illumination light source, and the white light emitting diode has been also used as a backlight source of a liquid crystal display (LCD). There have been developed a variety of methods for implementing such white light emitting diodes, which include a method of obtaining white light by coupling a fluorescent substance on a blue or ultraviolet light emitting diode chip as a single chip type, a method of obtaining white light by combining two or three light emitting diodes as a multi-chip type, and the like.

Among conventional techniques, in a case where a blue light emitting diode is used, the blue light emitting diode is used as an excitation light source and excited light is passed through a fluorescent substance of YAC (Yttrium Aluminum Garnet) emitting yellow light so as to implement a white light emitting diode. However, this method has disadvantages in that a flicker effect frequently occurs due to color separation resulting from a wide wavelength interval between blue and yellow light, and it is difficult to control color temperature and a color rendering evaluation index. Further, there is a method of implementing a white light emitting diode by applying red, green and blue fluorescent substances on an ultraviolet light emitting diode chip. However, there is a problem in that the ultraviolet light emitting diode chip has a short life span and low efficiency.

Meanwhile, although red, green and blue light emitting diode chips are combined to implement a white light emitting diode with multi-chips, there is a problem in that the operation voltage of each of the chips is not uniform, and the output of each of the chips varies depending on an ambient temperature.

FIGS. 1A and 1B are perspective and sectional views of a white light emitting diode according to a prior art. Referring to FIGS. 1A and 1B, there is shown a case where a blue light emitting diode is used as an excitation light source and excited light is passed through a fluorescent substance of YAG (Yttrium Aluminum Garnet) emitting yellow light so as to implement a white light emitting diode. The white light emitting diode shown in FIGS. 1A and 1B is a side view type fight emitting diode used as a backlight source of an LCD. The white light emitting diode comprises a substrate 110, a first lead terminal 120, a second lead terminal 130, a blue light emitting diode chip 140, a reflection portion 150, a wire 160, a fluorescent substance 170 and a molding member 180.

In the side view type white light emitting diode, the first lead terminal 120 and the second lead terminal 130 are arranged on the substrate 110, and the blue light emitting diode chip 140 is mounted on the second lead terminal 130. The reflection portion 150 for laterally reflecting light emitted from the blue light emitting diode chip 140 is formed on the substrate 110, the molding member 180 encapsulates the blue light emitting diode chip 140, and the fluorescent substance 170, e.g., YAG (Yttrium Aluminum Garnet) is mixed in the molding member 180. As a result, blue light emitted from the blue light emitting diode chip 140 excites the fluorescent substance 170 to generate yellow light, and white light is emitted due to constructive interference of the yellow light and the blue light. Thus, since only the blue light and the yellow light exist, there is limitation on expression of red and green, which causes a problem of deterioration of color reproducibility. Further, as described above, since white light emitting diodes implemented according to the prior art have problems, there is a current need for white light emitting diodes that solve these problems.

SUMMARY OF THE INVENTION

The present invention solves the aforementioned problems by providing a white light emitting diode wherein red, green and blue lights are emitted to improve color reproducibility. According to an aspect of the present invention, the white light emitting diode comprises a blue light emitting diode chip; a green light emitting diode chip; a molding member such as a resin that encapsulates the blue light emitting diode chip and the green light emitting diode chip and which contains a red fluorescent substance. The red fluorescent substance may advantageously comprise $(Sr_{1-x}Eu_x)S$ or $(Ca_{1-x}Eu_x)S$, where x is 0.001 to 0.02. The white light emitting diode may further include a reflection portion arranged on the substrate to reflect light emitted from the light emitting diode chips in a predetermined direction.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Hereinafter, preferred embodiments of the present invention will be described in detail with reference to the accompanying drawings. Light emitting diodes have been fabricated in various forms and fabricated as surface mount devices (SMD) adapted to be mounted directly on printed circuit boards. A SMD type light emitting diode is fabricated as a side view type or a top view type according to the desired application. SMD type white light emitting diodes of a side view and a top view will be described below with reference to FIGS. 2 and 3.

Figure 2A:
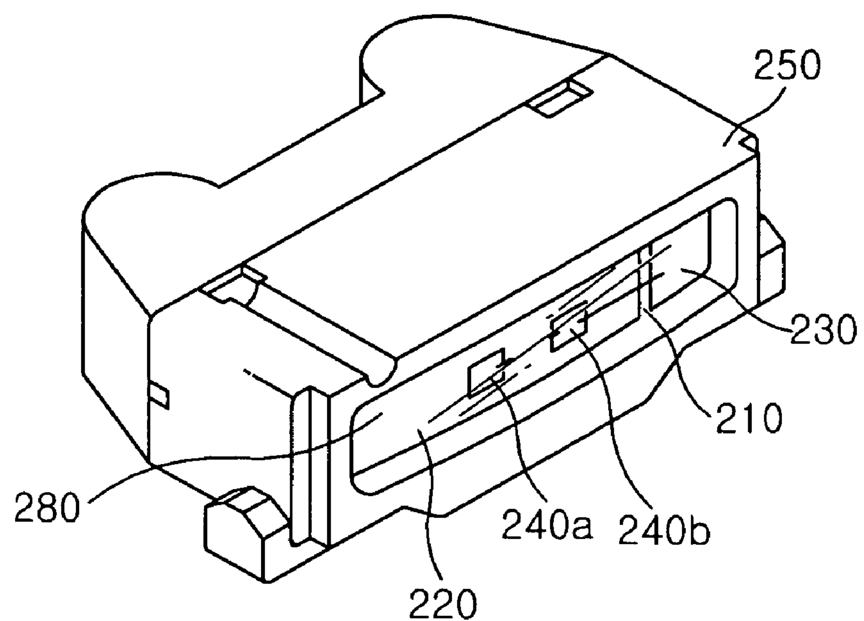
FIGS. 2A and 2B are perspective and sectional views of a white light emitting diode according to a first embodiment of the present invention.
Figure 2B:
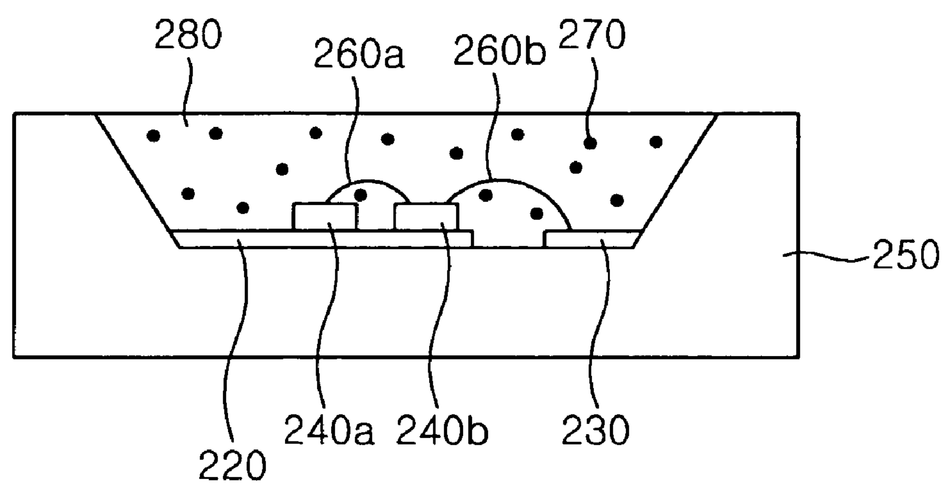

FIGS. 2A and 2B are perspective and sectional views of a white light emitting diode according to a first embodiment of the present invention. The white light emitting diode shown in FIGS. 2A and 2B is a side view type white light emitting diode, which may be used as a backlight source of an LCD. The white light emitting diode comprises a substrate 210, a first lead terminal 220, a second lead terminal 230, a blue light emitting diode 240*a*, a green light emitting diode 240*b*, a reflection portion 250, wires 260*a* and 260*b*, a red fluorescent substance 270 and a molding member 280. The first lead terminal 220 and the second lead terminal 230 are formed on the substrate 210. The blue light emitting diode chip 240*a* and the green light emitting diode 240*b* are mounted on the first lead terminal 220, and the blue light emitting diode chip 240*a* and the green light emitting diode 240*b* are connected to the second lead terminal 230 through the wires 260*a* and 260*b*. Although the blue light emitting diode chip 240*a* and the green light emitting diode 240*b* are connected in series in this embodiment, they are not limited thereto but may be connected in parallel.

The reflection portion 250 is formed on the substrate such that one side of the reflection portion is open to allow light emitted from the light emitting chips to be reflected in a lateral direction. The molding member 280 is contained in the reflection portion 250 so as to function to encapsulate the blue light emitting diode chip 240*a* and the green light emitting diode chip 240*b* and to fix the first lead terminal 220 and the second terminal 230. At this time, a transparent resin such as epoxy resin or silicone resin is used for the molding member.

The red fluorescent substance 270 is included in the molding member 280, and light emitted from the blue light emitting diode chip 240*a* or the green light emitting diode chip 240*b* excites the red fluorescent substance 270 to generate red light. Thus, blue, green and red light are mixed with one another so that white light can be emitted. Here, $(Sr_{1-x}Eu_x)S$ or $(Ca_{1-x}Eu_x)S$ where x is 0.001 to 0.02 is used as the red fluorescent substance 270. Besides, a variety of red substances may be used.

The blue light emitting chip 240*a* may be fabricated using IV group semiconductors such as silicone carbide (SiC), II-IV group semiconductors such as ZnSe and ZnS, GaN-based III-V group semiconductors, or the like, preferably using GaN-based semiconductors. In case of GaN, red light to near ultraviolet rays can be emitted depending on a composition ratio of In. Thus, it is possible to fabricate not only a blue light emitting diode chip but also a green light emitting diode chip.

Figure 3A:
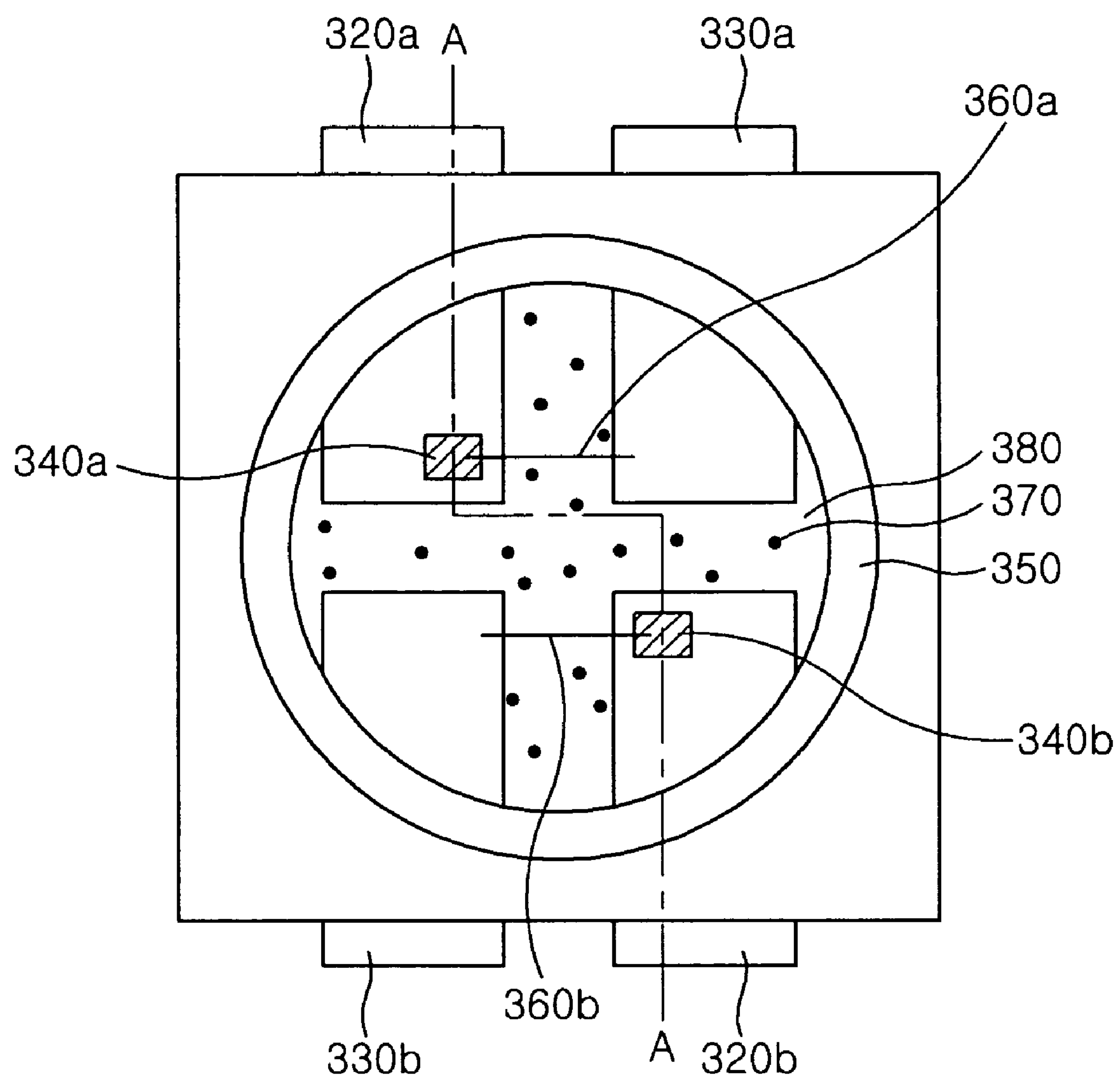
FIGS. 3A and 3B are plan and sectional views of a white light emitting diode according to a second embodiment of the present invention.
Figure 3B:
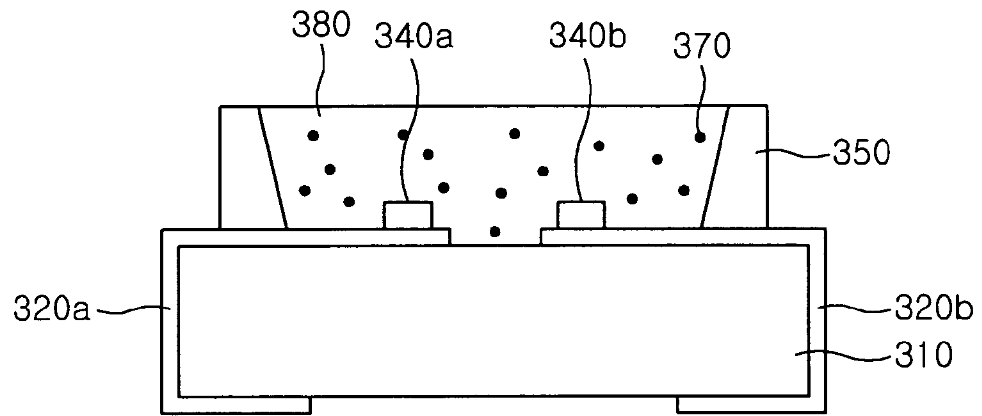

FIGS. 3A and 3B are plan and sectional views of a white light emitting diode according to a second embodiment of the present invention. The white light emitting diode shown in FIGS. 3A and 3B is a top view type white light emitting diode. This embodiment is different from the first embodiment in that light is emitted upwardly contrary to the first embodiment in which light is emitted in a lateral direction. Remaining components are similar to each other.

The white light emitting diode comprises a substrate 310, first lead terminals 320*a* and 320*b*, second lead terminals 330*a* and 330*b*, a blue light emitting diode chip 340*a*, a green light emitting diode chip 340*b*, a reflection portion 350, wires 360*a* and 360*b*, a red fluorescent substance 370, and a molding member 380.

The two first lead terminals 320*a* and 320*b*, and the two second lead terminals 330*a* and 330*b* are formed on the substrate 310. The blue light emitting diode chip 340*a* is mounted on the first lead terminal 320*a*, and the green light emitting diode chip 340*b* is mounted on the first lead terminal 320*b*. The blue light emitting diode chip 340*a* and the green light emitting diode chip 340*b* are connected to the second lead terminals 330*a* and 330*b* through the wires 360*a* and 360*b*, respectively.

The reflection portion 350 is formed to surround the blue and green light emitting diodes 340*a* and 340*b* on the substrate 310. At this time, to improve luminance and a light focusing ability, an inner wall of the reflection portion 350 surrounding the blue and green light emitting diode chips 340*a* and 340*b* may be formed to have a predetermined slope. As described above, the reflection portion 350 is formed so that reflection of light emitted from the blue and green light emitting diode chips 340*a* and 340*b* can be maximized.

The molding member 380 is applied in the reflection portion 350 so as to function to encapsulate the blue light emitting diode chip 340*a* and the green light emitting diode chip 340*b* and to fix the first lead terminals 320*a* and 320*b* and the second lead terminals 330*a* and 330*b*. At this time, a transparent resin such as epoxy resin or silicone resin is used for the molding member 380.

The red fluorescent substance 370 is included in the molding member 380, and light emitted from the blue light emitting diode chip 340*a* or the green light emitting diode chip 340*b* excites the red fluorescent substance 370 to generate red light. Thus, blue, green and red light are mixed with one another so that white light can be emitted. As described above, $(Sr_{1-x}Eu_x)S$ or $(Ca_{1-x}Eu_x)S$ wherein x is 0.001 to 0.02 is used as the red fluorescent substance 370.

Figure 4:
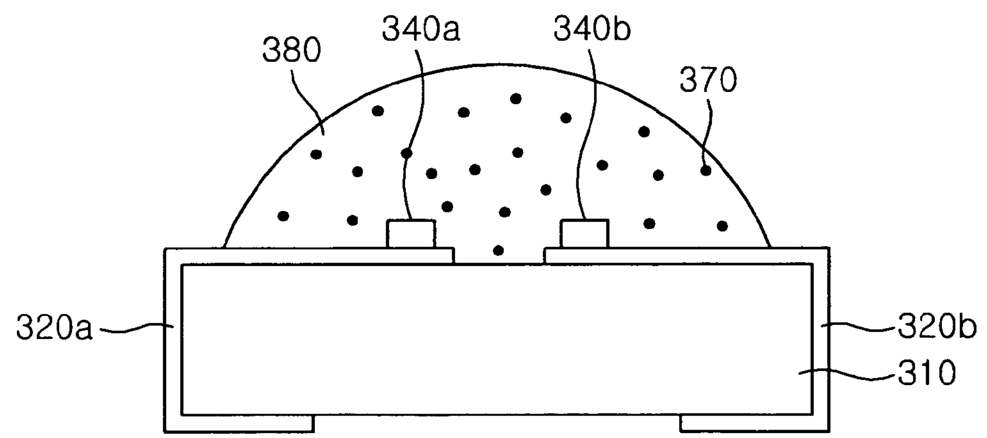
FIG. 4 is a sectional view of a white light emitting diode according to a third embodiment of the present invention.

FIG. 4 is a sectional view of a white light emitting diode according to a third embodiment of the present invention. The white light emitting diode according to the third embodiment is a chip type light emitting diode. This embodiment is different from the second embodiment in that there is no reflection portion, and remaining components are similar to each other. Further, although the molding member 380 is shown in the form of a hemisphere in this embodiment, it is not limited thereto but may be fabricated in various forms. Although white light emitting diodes in various forms are shown in FIGS. 2A to 4, the present invention is not limited thereto but may be applied to white light emitting diodes in other forms except these illustrative forms.

Figure 1A:
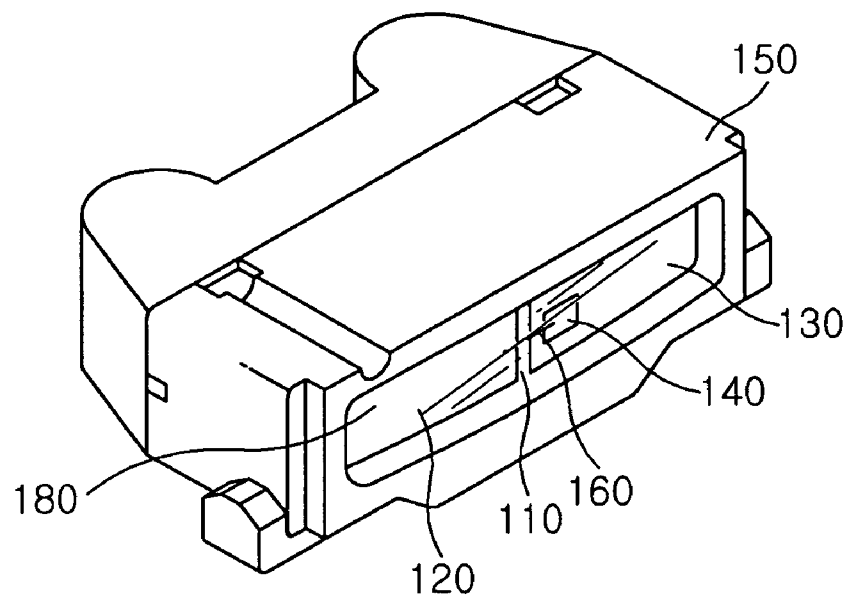
FIGS. 1A and 1B are perspective and sectional views of a white light emitting diode according to the prior art.
Figure 1B:
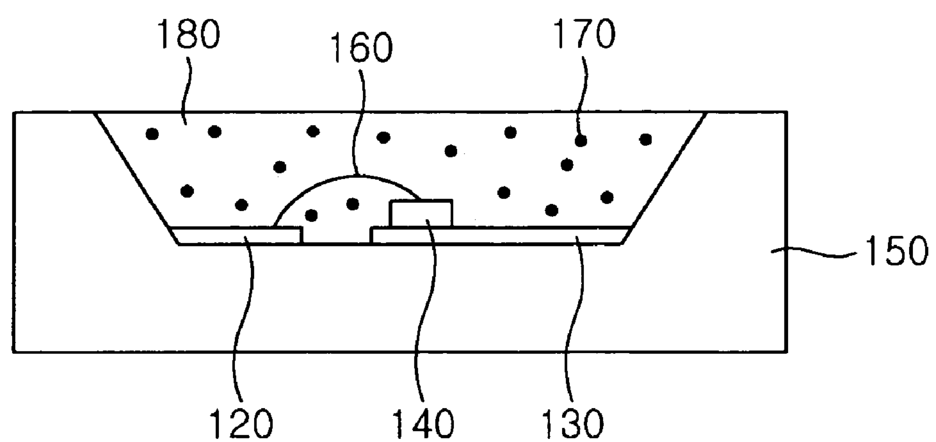
Figure 5A:
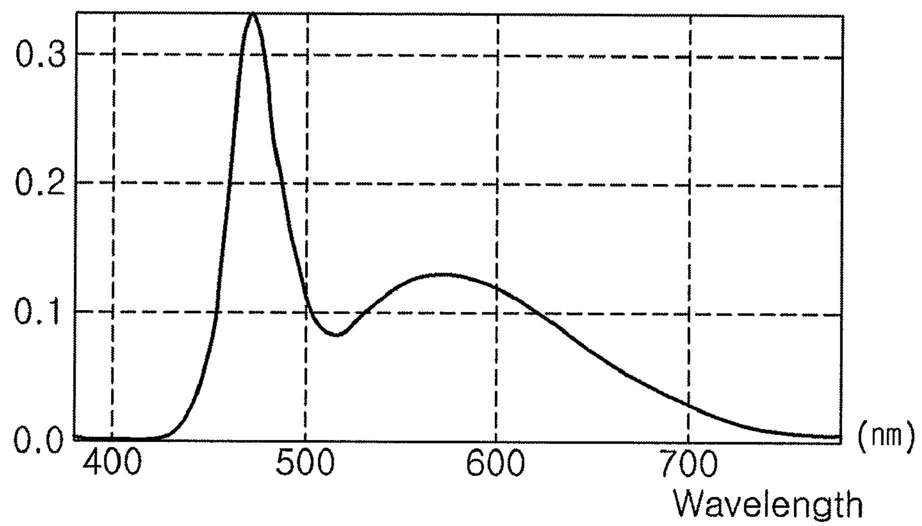
FIGS. 5A and 5B are views showing emission spectra of the white light emitting diodes according to the prior art and the present invention, respectively.
Figure 5B:
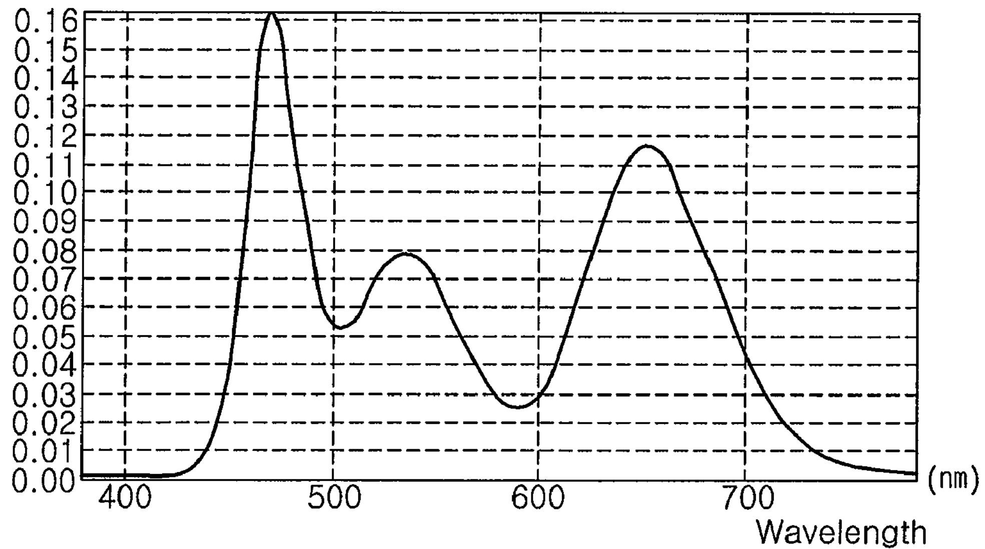
Figure 5C:
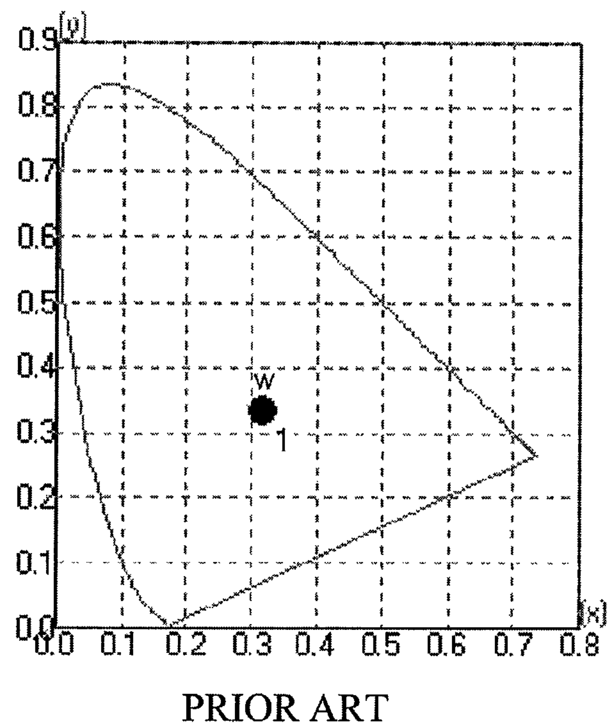
FIGS. 5C and 5D are views showing color coordinates according to the prior art and the present invention, respectively.
Figure 5D:
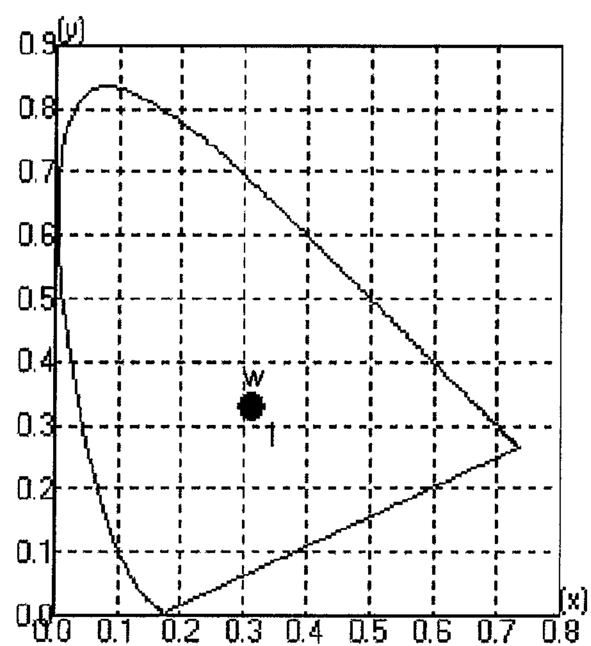

FIGS. 5A and 5B are views showing emission spectra of white light emitting diodes according to the prior art and the present invention, respectively, and FIGS. 5C and 5D are views showing color coordinates according to the prior art and the present invention. FIG. 5A shows the emission spectrum of the white light emitting diode according to the prior art, i.e., shown in FIG. 1, and FIG. 5B shows the emission spectrum of the white light emitting diode according to the present invention. As shown in FIG. 5A, emission peaks exist only in the vicinity of blue and yellow, and there is no emission peak in the vicinity of green and red. Thus, there is limitation on expression of red and green, resulting in deterioration of color reproducibility.

Referring to FIG. 5B, contrary to the emission spectrum shown in FIG. 5A, it can be seen that emission peaks exist in the vicinity of not only blue but also green and red. Thus, red and green can be readily expressed and color reproducibility is improved.

Referring to FIGS. 5C and 5D, it can be seen that there is little difference between the RGB color coordinates of white light emitted from the white light emitting diode according to the prior art and those of white light emitted from the white light emitting diode according to the present invention. In this simulation, a CIE 1931 (International Commission for Illumination) color coordinate is used, and a color reproducibility defined in the NTSC (National Television Standard Committee) is used. The color reproducibility is defined as follows;

Color reproducibility=(the triangular area of the RGB color coordinate/the triangular area of the NTSC standard color coordinate)*100%

The values of color coordinates shown in FIGS. 5C and 5D are shown in the following Table 1.

TABLE 1

| | Prior art | | Present invention | |
|---|---|---|---|---|
| | Coordinates | | | |
| Color | x | y | x | y |
| White | 0.324 | 0.344 | 0.326 | 0.363 |
| Red | 0.620 | 0.365 | 0.673 | 0.316 |
| Green | 0.351 | 0.588 | 0.284 | 0.648 |
| Blue | 0.146 | 0.096 | 0.145 | 0.131 |
| Color Reproducibility | 56.2% | | 78.1% | |

The color reproducibility of the white light emitting diode according to the prior art is about 56.2%, but that of the white light emitting diode according to the present invention is about 78.1%. Thus, according to the present invention, the color reproducibility of a white light emitting diode is improved considerably.

The foregoing are merely exemplary embodiments of the white light emitting diode according to the present invention. The present invention is not limited to the aforementioned embodiments, and it will be understood by those skilled in the art that various modifications and changes can be made thereto without departing from the technical spirit and scope of the present invention as defined by the appended claims.

What is claimed is:

1. A white light emitting diode, comprising:

a substrate;

first, second, third, and fourth terminals on the substrate;

a blue light emitting diode chip on the first terminal and in electrical communication with the first and second terminals;

a green light emitting diode chip on the third terminal and in electrical communication with the third and fourth terminals; and a molding member for encapsulating the blue light emitting diode chip and the green light emitting diode chip, wherein the molding member comprises a red fluorescent substance, and further wherein the blue light emitting diode chip and the green light emitting diode chip are electrically isolated from each other, and further wherein the blue light emitting diode chip and the green light emitting diode chip are disposed diagonally across from each other and, within the molding member, the second terminal and fourth terminal are disposed diagonally across from each other.

2. The white light emitting diode as claimed in claim 1, wherein the red fluorescent substance comprises $(Sr_{1-x}Eu_x)S$ or $(Ca_{1-x}Eu_x)S$ where x is 0.001 to 0.02.

3. The white light emitting diode as claimed in claim 2, wherein the molding member comprises a resin.

4. The white light emitting diode as claimed in claim 2, wherein a reflective portion is arranged on the substrate to reflect light emitted from the light emitting diode chips in a predetermined direction.

* * * * *